United States Patent [19]
Yoshioka

[11] Patent Number: 6,122,496
[45] Date of Patent: Sep. 19, 2000

[54] DEVICE AND METHOD FOR CONTROLLING FREQUENCY CHARACTERISTIC OF A FILTER

[75] Inventor: Kenji Yoshioka, Tokyo, Japan

[73] Assignee: NEC Corporation, Tokyo, Japan

[21] Appl. No.: 09/031,602

[22] Filed: Feb. 27, 1998

[30] Foreign Application Priority Data

Mar. 4, 1997 [JP] Japan .................................. 9-049379

[51] Int. Cl.$^7$ .................................................. H04B 1/10
[52] U.S. Cl. ........................... 455/307; 455/213; 327/553
[58] Field of Search .................. 455/192.1, 266, 455/340, 307, 501, 77, 192.2, 575, 70, 217, 188.1, 213, 255, 260, 339; 375/316, 343, 350; 329/318, 319, 352, 349

[56] References Cited

U.S. PATENT DOCUMENTS

| | | |
|---|---|---|
| 4,843,343 | 6/1989 | Pace . |
| 5,220,686 | 6/1993 | Kasperkovitz et al. . |
| 5,465,410 | 11/1995 | Hiben et al. ............................ 455/266 |
| 5,475,871 | 12/1995 | Shalev et al. ............................ 455/70 |
| 5,499,396 | 3/1996 | Reime .................................... 455/266 |
| 5,507,025 | 4/1996 | Rodeffer ................................. 455/266 |
| 5,555,453 | 9/1996 | Kajimoto et al. ....................... 455/266 |
| 5,566,365 | 10/1996 | Yokoya et al. .......................... 455/307 |
| 5,572,552 | 11/1996 | Dent et al. .............................. 375/343 |
| 5,584,063 | 12/1996 | Brinkhaus ............................... 455/266 |
| 5,604,927 | 2/1997 | Moore .................................... 455/266 |
| 5,678,214 | 10/1997 | Azuma .................................... 455/217 |
| 5,691,666 | 11/1997 | Owen ...................................... 329/319 |
| 5,715,529 | 2/1998 | Kianush et al. ......................... 455/266 |
| 5,758,296 | 5/1998 | Nakamura ............................... 455/575 |

FOREIGN PATENT DOCUMENTS

| | | |
|---|---|---|
| 0421423 A2 | 4/1990 | European Pat. Off. . |
| 0626795 A2 | 5/1994 | European Pat. Off. . |
| 02274115 | 11/1990 | Japan . |
| 2-274115 | 11/1990 | Japan . |

OTHER PUBLICATIONS

European Search Report, 98103725.2–2211, Aug. 10, 1999.

*Primary Examiner*—Dwayne D. Bost
*Assistant Examiner*—Charles Craver
*Attorney, Agent, or Firm*—Whitham, Curtis & Whitham

[57] ABSTRACT

When the frequency band of an intermediate frequency (IF) signal input to a filter rises due to temperature variation, the center voltage corresponding to the IF signal also rises. As a result, a difference occurs between the center voltage and a preselected reference voltage. An output current produced by converting the difference is so output as to increase a control current, thereby shifting the frequency characteristic of the filter to the higher frequency side. When the frequency band of the IF signal falls due to temperature variation, the center voltage also falls. The resulting difference between the center voltage and the reference voltage is also transformed to an output current. This output current is so output as to reduce the control current with the result that the frequency characteristic of the filter is shifted to the lower frequency side.

6 Claims, 11 Drawing Sheets f2(IN)

f2(OUT)

f4(IN)

f4(OUT)

DEVICE AND METHOD FOR CONTROLLING FREQUENCY CHARACTERISTIC OF A FILTER

BACKGROUND OF THE INVENTION

1. Field of the Invention

The present invention relates to a receiver and, more particularly, to a superheterodyne type radio receiver.

2. Description of the Related Art

Generally, a radio receiver includes a filter for filtering out noise contained in a received radio signal. It is desirable with this kind of filter to reduce variation in characteristic ascribable to, e.g., scattering among its constituents, temperature variation, and power source voltage variation. It is also desirable that the filter be operable with high stability and accuracy. A stable and accurate gyrator filter circuit is disclosed in, e.g., Japanese laid-open patent application heisei 2-274115 assigned to the same assignee as the present application.

Referring to FIG. 1, the gyrator filter circuit includes a first and a second gyrator filter 1 and 2, respectively. The first gyrator filter 1 has a preselected frequency characteristic for an input signal IN when a circuit current I1 fed to the filter 1 has a preselected value. When the value of the circuit current I1 varies, the frequency characteristic of the current I1 varies substantially in parallel in the high-and-low direction of frequency. The filter 1 produces an output signal OUT by filtering the input signal IN.

The second gyrator filter 2 is identical in function and characteristic with the first gyrator filter 1. A reference signal generator 3 generates a reference signal Vf having a frequency relating to the cut-off range of a required frequency characteristic. The reference signal Vf is input to the second filter 2. The filter 2 applies its output signal VF to an amplitude detector 4 by filtering the reference signal Vf.

The amplitude detector 4 detects the output signal VF of the second filter 2 while feeding a voltage VD corresponding to the level of the signal VF to a comparator 5. The comparator 5 includes an operational amplifier (OP AMP) 6. The comparator 5 compares the voltage VD output from the amplitude detector 4 with a DC reference voltage VR. The result of comparison is fed from the comparator 5 to a current source 7 as a comparison signal VC.

The current source 7 outputs, in response to the comparison signal VC, a circuit current I2 causing the voltage VD output form the amplitude detector 4 to vary toward the DC reference voltage VR, and a circuit current I1 equal to the circuit current I2. The current source 7 feeds the circuit currents I1 and I2 to the first and second gyrator filters 1 and 2, respectively.

In the above filter circuit, assume that the frequency characteristics of the two gyrator filters 1 and 2 are shifted to the higher frequency side from their stable conditions due to, e.g., scattering among constituent parts, temperature variation, or power source voltage variation. Then, the level of the signal VF output from the second filter 2 increases, and so does the level of the voltage VD output from the amplitude detector 4. Because the voltage VD rises above the DC reference voltage VR, the OP AMP 6 lowers the level of the comparison signal VC. Because the level of the comparison signal VC is lowered, the current source 7 lowers the circuit currents I1 and I2 and then delivers them to the filters 1 and 2, respectively. The decrease in the circuit currents I1 and I2 causes the frequency characteristics of the filters 1 and 2 to shift to the lower frequency side, i.e., to the original frequency characteristics.

In the conventional gyrator filter circuit, a negative feedback loop to the second filter 2 is formed in order to insure the stable and accurate frequency characteristic of the first filter 1. With this configuration, it is possible to reduce the variation of filter circuit characteristic ascribable to scattering among the constituent parts of the two filters themselves, temperature variation, power source voltage variation, and so forth.

However, the conventional gyrator filter circuit gives no consideration to the variation of the characteristic of the entire radio receiver including the filter circuit. This brings about a problem that a received signal misses the frequency band of an intermediate frequency (IF) filter and is attenuated due to the deviation of the output frequency of a local oscillator, i.e., a frequency offset, deteriorating receipt sensitivity to a critical degree.

To detect an error of a filter output, it is necessary to compare the filter output with some reference. The prerequisite is that the reference be constant under any possible condition in order to insure accurate error detection. The conventional filter circuit detects the error of the filters by using the level voltage output from the amplitude detector. To implement the level voltage, the conventional filter circuit includes the reference signal generator. However, accurate adjustment of the filters is not achievable unless the oscillation frequency of the reference signal output from the reference signal generator remains constant, i.e., unless the reference signals is highly accurate. The reference signal is usually output from a quartz oscillator. Although the accurate reference signal may be implemented if the temperature variation and production errors of the quartz oscillator are reduced, the resulting quartz oscillation is extremely expensive.

Today, in parallel with the increase in the frequency of a channel frequency, the pass band of an IF band pass filter is increasing in order to reduce the influence of a frequency offset ascribable to the variation of a local oscillation frequency caused by varying temperature. This, however, cannot be done without degrading the carrier-to-noise (CN) ratio of a receiver.

SUMMARY OF THE INVENTION

It is therefore an object of the present invention to provide a receiver capable of insuring a stable frequency characteristic and desirable receipt frequency despite any frequency offset ascribable to temperature variation, using the fact that the frequency characteristic of a filter can be shifted by a control current.

It is another object of the present invention to provide a receiver capable of reducing the influence of a frequency offset ascribable to temperature variation without resorting to a reference signal generator or reference signal.

It is another object of the present invention to provide a receiver capable of reducing, with a narrow band design, the influence of a frequency offset ascribable to temperature variation by shifting the pass band of a filter in matching relation to the frequency offset.

In accordance with the present invention, a receiver includes a radio section for amplifying a received signal to thereby output an amplified signal. A filter inputs the amplified signal and has a preselected frequency characteristic. A feeding section feeds a first control signal to the filter. A first outputting section outputs a second control signal corresponding to the frequency of said signal. A second outputting section outputs a third control signal corresponding to a difference between the second control signal and a preselected reference value. A control section controls the preselected frequency characteristic of the filter in accordance with the first control signal and third control signal. It is desirable that the amplified signal is a frequency converted signal. It is desirable that the filter is a gyrator filter and the receiver is a radio pager. Further, it is desirable that the first control signal, the second control signal and the third control signal are a control current, a DC voltage, and an error current, respectively. Moreover, it is desirable that the second outputting section converts a difference between a center voltage of the DC voltage and the preselected reference voltage to the error current.

Also, in accordance with the present invention, a device for controlling the frequency characteristic of a filter includes a feeding section for feeding a first control signal to the filter. A first outputting section outputs a second control signal corresponding to the output signal of said filter. A second outputting section outputs a third control signal corresponding to a difference between the second control signal and a preselected reference value. A control section controls the preselected aracteristic of the filter in accordance with the first control signal and third control signal. It is desirable that the filter is a gyrator filter and the receiver is a radio pager.

Further, in accordance with the present invention, a receiver includes a radio section for amplifying a received signal to thereby output an amplified signal. A filter has a preselected frequency characteristic. A current source feeds a first control signal to the filter. An integrator outputs a second control signal relating to the amplified received signal. A voltage-to-current converter outputs a third control signal corresponding to a difference between the second control signal and a preselected reference value. A controller controls the preselected frequency characteristic of the filter in accordance with the first control signal and third control signal.

Moreover, in accordance with the present invention, a device for controlling the frequency characteristic of a filter includes a filter having a preselected frequency characteristic. A current source feeds a first control signal to the filter. An integrator outputs a second control signal corresponding to the output signal of the filter. A voltage-to-current converter outputs a third control signal corresponding to a difference between the second control signal and a preselected reference value. A controller controls the preselected frequency characteristic of the filter in accordance with the first control signal and third control signal.

In the present invention, when the frequency band of an intermediate frequency (IF) signal input to a filter rises due to temperature variation, the center voltage corresponding to the IF signal also rises. As a result, a difference occurs between the center voltage and a preselected reference voltage. An output current produced by converting the difference is so output as to increase a control current, thereby shifting the frequency characteristic of the filter to the higher frequency side. When the frequency band of the IF signal falls due to temperature variation, the center voltage also falls. The resulting difference between the center voltage and the reference voltage is also transformed to an output current. This output current is so output as to reduce the control current with the result that the frequency characteristic of the filter is shifted to the lower frequency side.

In accordance with the present invention, the frequency characteristic of the gyrator filter is shifted in accordance with the frequency band of an IF signal input to the filter. Therefore, even when a frequency offset occurs due to temperature variation, the frequency characteristic of the gyrator filter remains stable and insures desirable receipt sensitivity.

Further, the present invention reduces the influence of a frequency offset ascribable to temperature variation without resorting to any reference signal generating circuit. This successfully reduces the size and cost of a radio pager.

In addition, the pass band of the gyrator filter is shifted in accordance with the above frequency offset. This protects a receiver from deterioration in CN power ratio.

BRIEF DESCRIPTION OF THE DRAWINGS

These and other objects, features and advantages of the present invention will become more fully apparent from the following detailed description taken in conjunction with the accompanying drawings in which.

DETAILED DESCRIPTION OF THE PREFERRED EMBODIMENT

Figure 2:
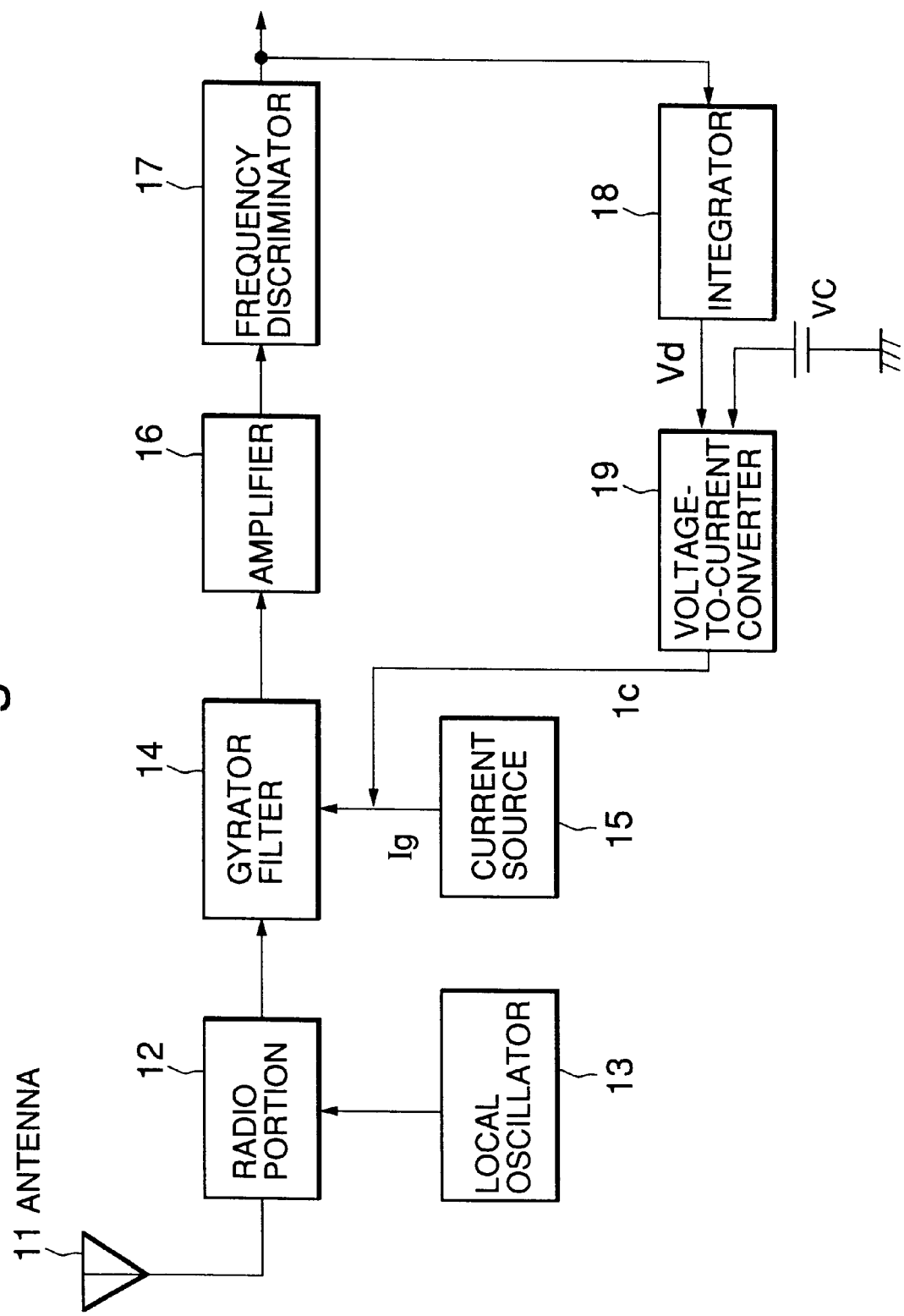
FIG. 2 is a preferred block diagram schematically showing a receiver embodying the present invention and implemented as a radio pager.

Referring to FIG. 2, a radio receiver embodying the present invention is shown and implemented as a radio pager by way of example. As shown, the radio pager includes an antenna 1 and a radio 2 connected to the antenna 1. The radio 12 amplifies a paging signal coming in through the antenna 1 and mixes the amplified paging signal with a local oscillation frequency signal output from a local oscillator 13, thereby outputting an intermediate frequency (IF) signal. A current source 15 feeds a first control signal, preferably a control current Ig, to a filter preferably implemented as a gyrator filter 14 in order to shift the frequency characteristic of the filter 14. The gyrator filter 14 filters the IF signal input thereto from the radio 12. An amplifier 16 amplifies the IF signal filtered by the gyrator filter 14. A frequency discriminator 17 converts the amplified IF signal output from the amplifier 16 to a voltage to thereby produce a baseband signal. An integrator 18 integrates the baseband signal so as to output a second control signal, preferably a DC voltage Vd. A voltage-to-current converter 19 converts a difference between the DC voltage Vd and a reference voltage Vr to a third control signal, preferably an error current Ic. The reference voltage Vr is equal to a DC voltage Vd which the integrator 18 will output when a non-modulated IF signal free from an error is input to the frequency discriminator 17.

Figure 3:
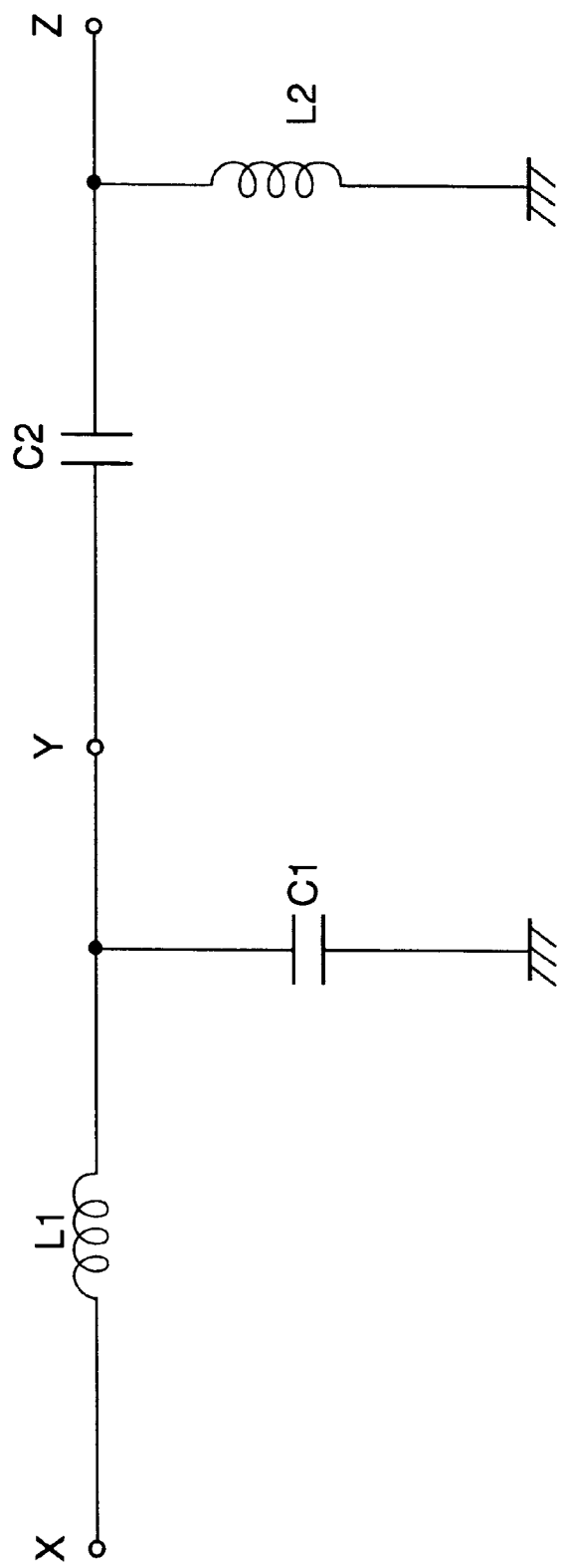
FIG. 3 shows a preferred configuration of a gyrator filter shown in FIG. 2.

FIG. 3 shows a preferred configuration of the gyrator filter 14. As shown, the filter 14 is made up of an LC low pass filter (X-Y) and a high pass filter (Y-Z) connected together.

Figure 4:
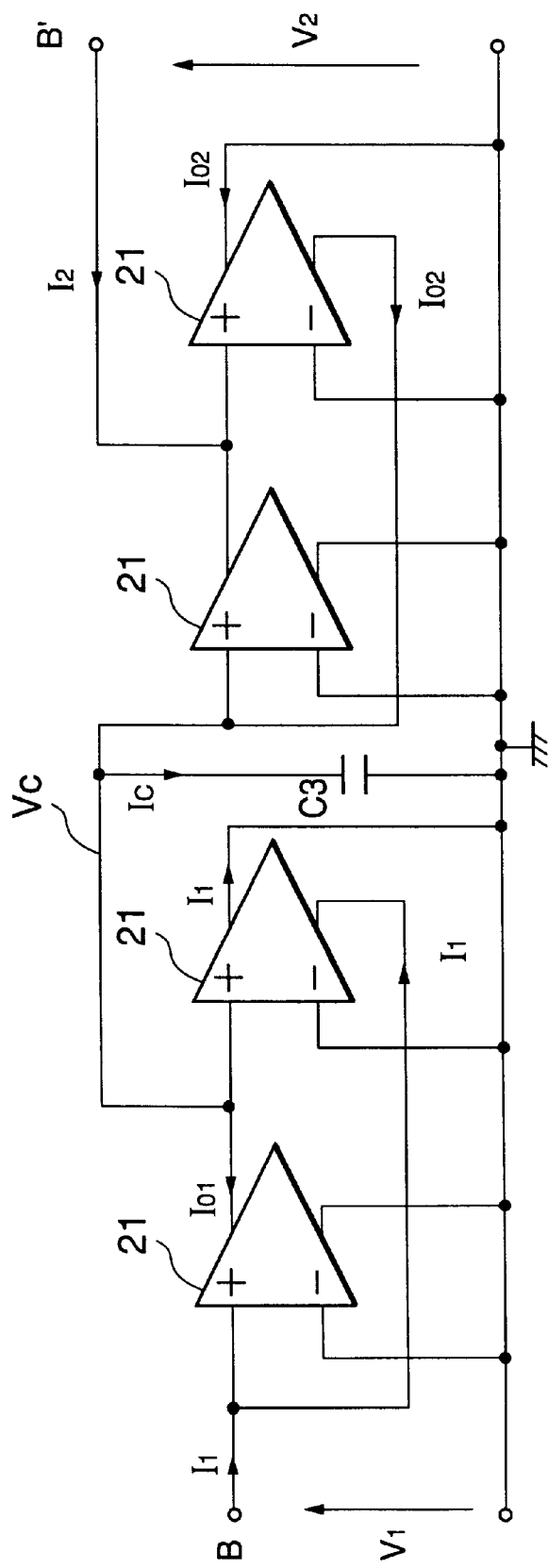
FIG. 4 shows a preferred configuration of floating L1 shown in FIG. 3.

FIG. 4 shows an active circuit representative of floating L1, FIG. 3, implemented by transfer conductances. As shown, floating L1 has four transconductance amplifiers 21 and a capacitor C3. The transconductance amplifiers 21 each plays the role of a voltage-to-current converter, as will be described specifically later. Assuming that an input potential difference is Vi, and that an output current is Io, then a transconductance gain G is expressed as:

$$G = \frac{dIo}{dVi} \qquad \text{Eq. (1)}$$

Assuming various currents and voltages shown in FIG. 4, there hold the following relations:

$$I_{o1} = GV1 \qquad \text{Eq. (2)}$$

$$I_{o2} = GV2 \qquad \text{Eq. (3)}$$

$$I1 = -GVc \qquad \text{Eq. (4)}$$

There also hold:

$$Vc = Ic/j\omega C3 \qquad \text{Eq. (5)}$$

$$I_{o2} = I_{o1} + Ic \qquad \text{Eq. (6)}$$

where $\omega$ denotes an input angular frequency.

By substituting the Eqs. (2)–(4) for the Eqs. (5) and (6) for deleting Vc, there is produced:

$$\frac{V1 - V2}{I1} = \frac{1}{G^2} j\omega C2 \qquad \text{Eq. (7)}$$

where (V1−V2)/I1 is representative of an impedance between points B and B'. Therefore, assuming:

$$L1 = \frac{1}{G^2} C2$$

the Eq. (7) is rewritten as:

$$\frac{V1 - V2}{I1} = j\omega L1 \qquad \text{Eq. (8)}$$

It will be seen that the result represented by the Eq. (8) is equivalent to floating L1 shown in FIG. 4.

Figure 5:
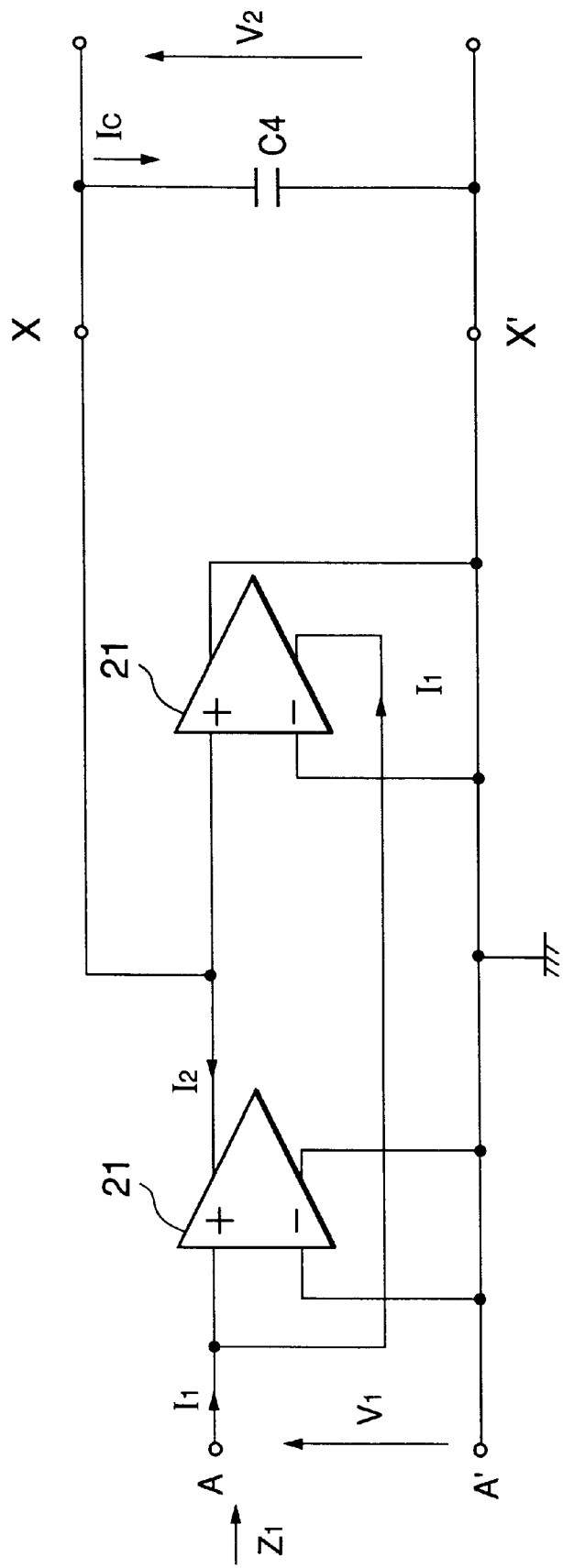
FIG. 5 shows a preferred configuration of grounding L2 also shown in FIG. 3.

FIG. 5 shows an active circuit representative of grounding L2 also implemented by transconductances. As shown, L2 is made up of two transconductance amplifiers 21 and a capacitor C4. Assuming currents and voltages shown in FIG. 5, then there hold the following relations:

$$I2 = GV1 \qquad \text{Eq. (9)}$$

$$I1 = -GV2 \qquad \text{Eq. (10)}$$

$$V2 = Ic/j\omega C4 \qquad \text{Eq. (11)}$$

$$I2 = -Ic \qquad \text{Eq. (12)}$$

By rearranging the Eqs. (9)–(12), there is produced:

$$\frac{V1}{I1} = \frac{1}{G^2} j\omega C4 \qquad \text{Eq. (13)}$$

where V1/I1 is representative of an impedance between points A and A'. Therefore, considering:

$$L4 = \frac{1}{G^2} C4$$

the Eq. (13) is written as:

$$\frac{V1}{I1} = j\omega L4 \qquad \text{Eq. (14)}$$

It will be seen that the result represented by the Eq. (14) is equivalent to grounding L2 shown in FIG. 5.

Figure 6A:
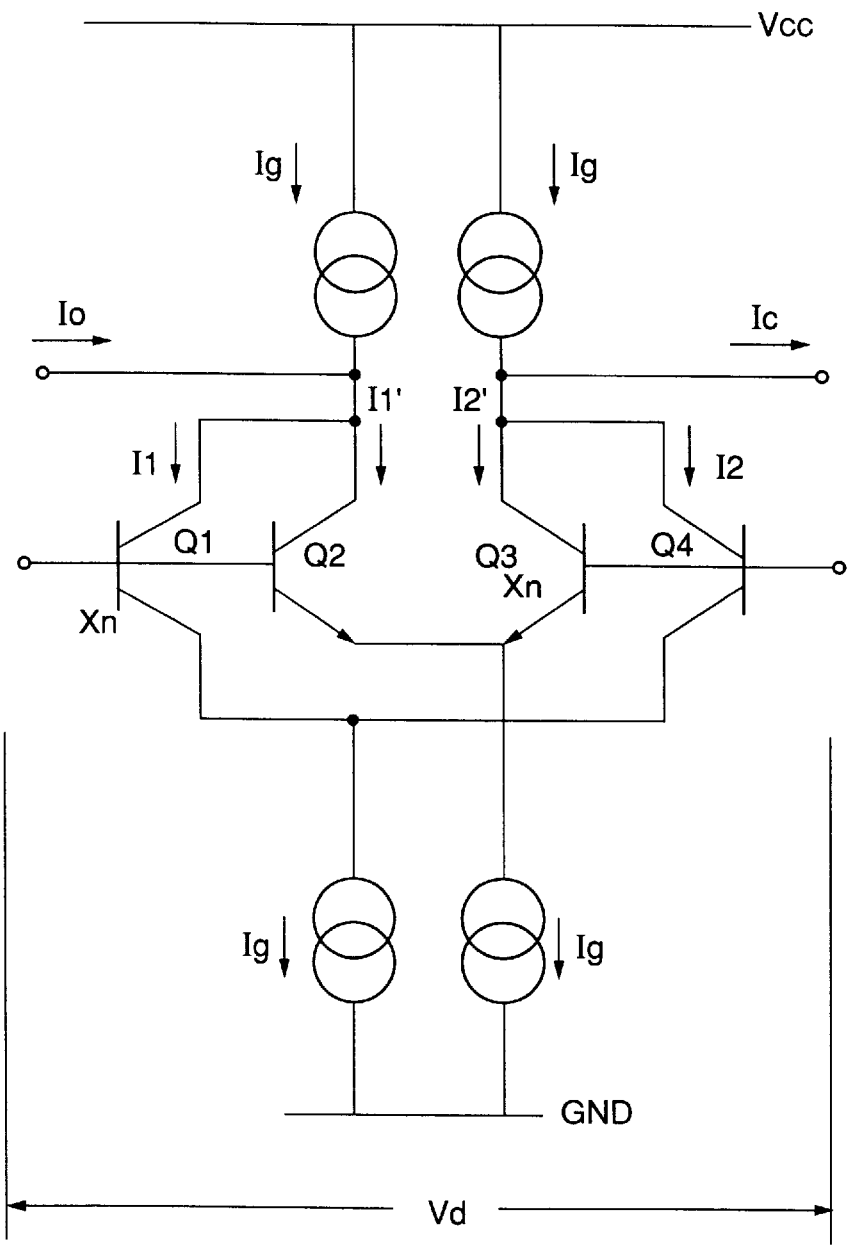
FIGS. 6A and 6B show a preferred configuration of a transconductance amplifier included in the configurations of FIGS. 3 and 4.
Figure 6B:
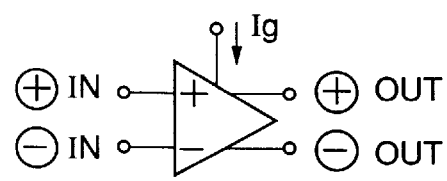

Reference will be made to FIGS. 6A and 6B for describing a preferred configuration of any one of the transconductance amplifiers 21 shown in FIGS. 4 and 5. FIG. 6B is a block diagram schematically showing the transconductance amplifier 21.

As shown in FIG. 6A, the amplifier 21 includes NPN transistors Q1–Q4 having whose emitter areas are related as follows:

$$Q1:Q4 = Q3:Q2 = n:1 \qquad \text{Eq. (15)}$$

The Kirchhoff's law derives:

$$Io + Ig = I1 + I1' \qquad \text{Eq. (16)}$$

$$I1 + I2 = Ig \qquad \text{Eq. (17)}$$

$$I1' + I2' = Ig \qquad \text{Eq. (18)}$$

Because the input potential difference Vd is represented by the base-emitter voltage difference $\Delta VBE$ of the transistors Q1 and Q4, the following equation is derived:

$$Vd = \Delta V_{BE} = V_T l_n \frac{I_1}{nI_s} - V_T l_n \frac{I_2}{I_s} = V_T l_n \frac{I_1}{nI_s} \qquad \text{Eq. (19)}$$

The Eq. (19) may be rewritten as:

$$I_1 = nI_2 \exp \frac{Vd}{V_T} \qquad \text{Eq. (20)}$$

Rearranging the above Eq. (20) with respect to the collector current I2 of the transistor Q3, there holds:

$$I_2 = \frac{I_1}{n} \exp\left(-\frac{Vd}{V_T}\right) \qquad \text{Eq. (21)}$$

Likewise, the input potential difference Vd between the transistors Q2 and Q3 is produced by:

$$Vd = \Delta V_{BE} = V_T l_n \frac{I'_1}{I_s} - V_T l_n \frac{I'_2}{nI_s} = V_T l_n \frac{nI'_1}{I'_2} \qquad \text{Eq. (22)}$$

The Eq. (22) may be rewritten as:

$$I'_1 = \frac{I_2}{n} \exp\frac{Vd}{V_T} \qquad \text{Eq. (23)}$$

Rearranging the above Eq. (23) with respect to the collector current I2' of the transistor Q4, there holds:

$$I'_2 = nI'_1 \exp\left(-\frac{Vd}{V_T}\right) \qquad \text{Eq. (24)}$$

By substituting the Eq (21) for the Eq. (17), the following equation is produced:

$$I_1 + \frac{I_1}{n}\exp\left(-\frac{Vd}{V_T}\right) = Ig \qquad \text{Eq. (25)}$$

Rearranging the Eq. (25) with respect to the collector current I1 of the transistor Q1, there is produced:

$$I_1 = \frac{Ig}{1 + \frac{1}{n}\exp\left(-\frac{Vd}{V_T}\right)} \qquad \text{Eq. (26)}$$

Likewise, by substituting the Eq. (24) for the Eq. (18), the following equation is produced:

$$I'_1 + nI'_1 \exp\left(-\frac{Vd}{V_T}\right) = Ig \qquad \text{Eq. (27)}$$

Rearranging the Eq. (27) with respect to the collector current I1' of the transistor Q2, the following equation is derived:

$$I'_1 = \frac{Ig}{1 + n\exp\left(-\frac{Vd}{V_T}\right)} \qquad \text{Eq. (28)}$$

Further, by substituting the Eqs. (26) and (28) for the Eq. (16), there is produced:

$$Io = \left[\frac{1}{1 + \frac{1}{n}\exp\left(-\frac{Vd}{V_T}\right)} + \frac{1}{1 + n\exp\left(-\frac{Vd}{V_T}\right)} - 1\right] Ig \qquad \text{Eq. (29)}$$

A transconductance G is expressed as:

$$G = \frac{dIo}{dVd} \qquad \text{Eq. (30)}$$

$$= \frac{Ig}{V_T}\left[\frac{1}{n\left[1 + \frac{1}{n}\exp\left(-\frac{Vd}{V_T}\right)\right]^2} + \frac{n}{\left[1 + n\exp\left(-\frac{Vd}{V_T}\right)\right]^2}\right]\exp\left(-\frac{Vd}{V_T}\right)$$

By substituting the input potential difference Vd=0 for the Eq. (30), there is produced:

$$G = \frac{Ig}{V_T} \frac{2n}{(1+n)^2} \left(V_T = \frac{kT}{q}\right) \qquad \text{Eq. (31)}$$

The reciprocal of the transconductance G is a transresistance Rg, i.e., Rg=1/G. It follows that if the emitter area ratio is fixed, then the transresistance Rg can be varied on the basis of the common current Ig.

Figure 1:
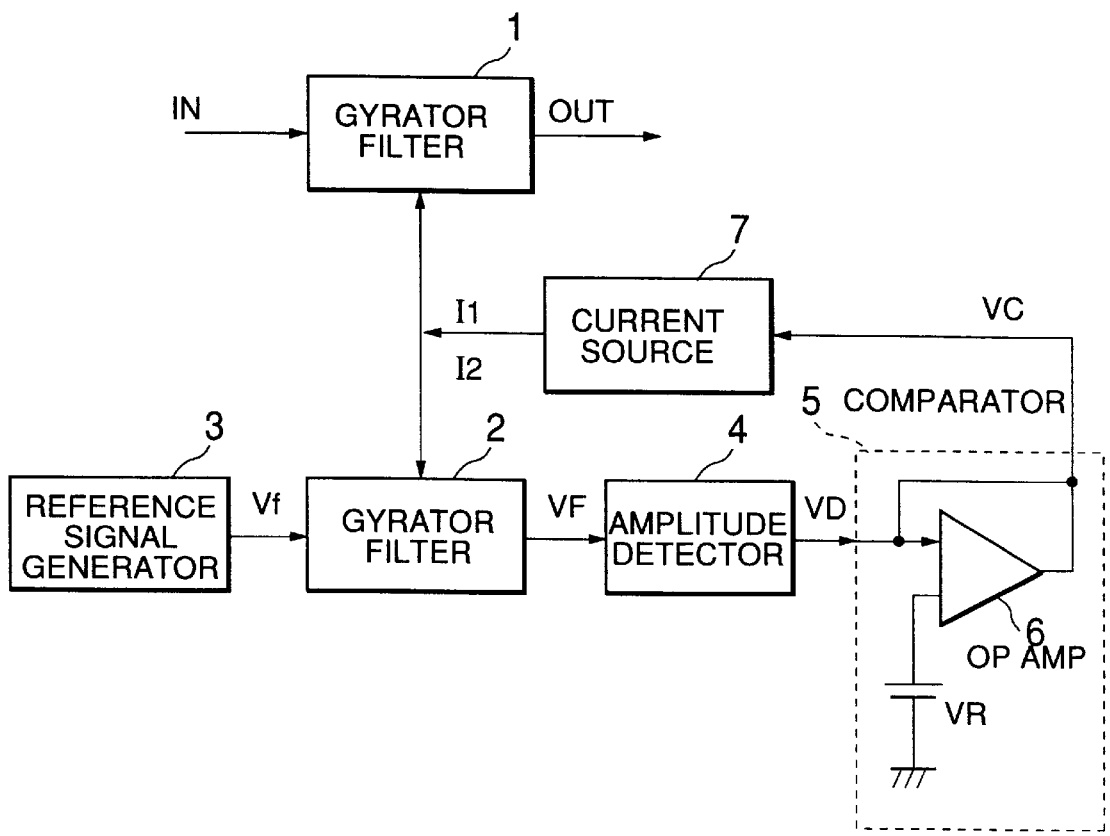
FIG. 1 is a block diagram schematically showing a conventional filter circuit.
Figure 7:
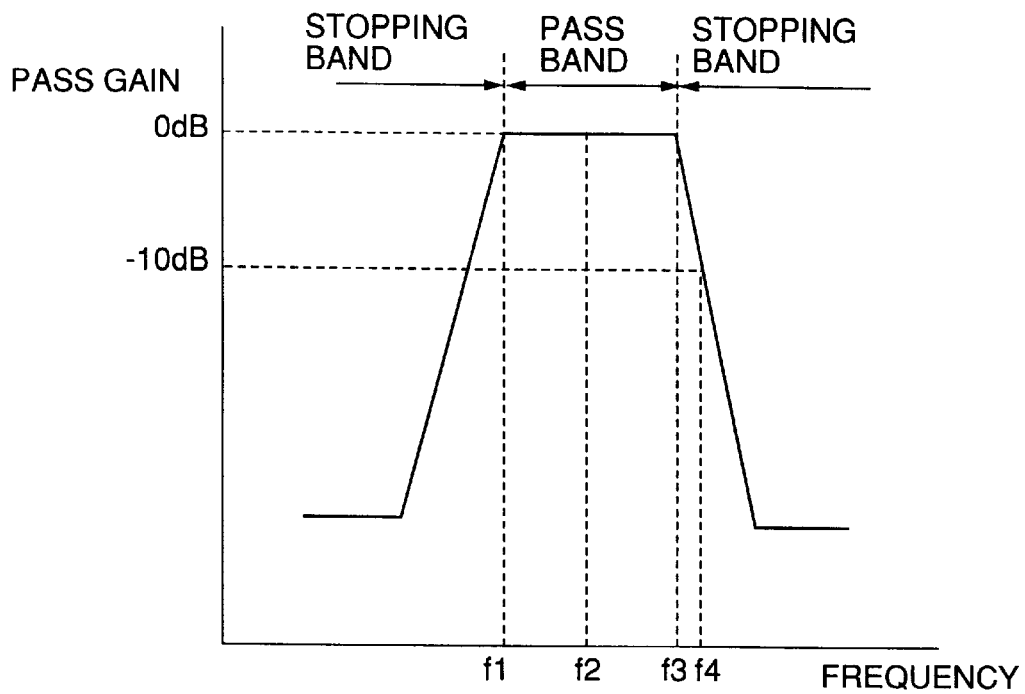
FIG. 7 shows the frequency characteristic of a preferred configuration of the gyrator filter shown in FIG. 2.

Reference will be made to FIG. 7 for describing the frequency characteristic of a preferred configuration of the gyrator filter 14 shown in FIG. 1. Assume that the filter 14 receives an input signal f(in) and produces an output signal f(out). As shown, the frequency band in which the gain loss of the input signal f(in) passed through the filter 14 is small, i.e., f1–f3 is referred to as a pass band and defined by, e.g., a 3 dB band width. On the other hand, the frequency band in which the above gain loss is great, e.g., f4 is referred to as a stopping or attenuating band. Usually, the frequency of the input signal f(in) lies in the frequency band f1–f3. However, when the frequency of the input signal f(in) changes due to a change in temperature, the level of the output signal f(out) changes noticeably. That is, the level of the output signal f(out) is determined by the frequency band of the input signal f(in) in which the pass band of the filter 14 lies.

Figure 8A:
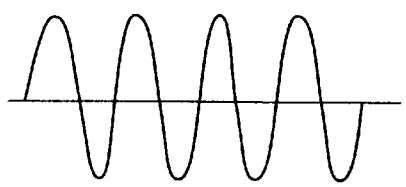
FIGS. 8A–8D show a preferred relation between signals input to and output from the gyrator filter shown in FIG. 2.
Figure 8B:
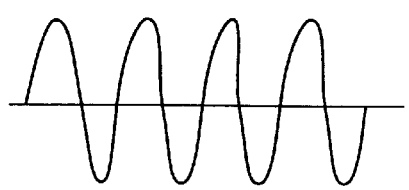

The relation between the input signal f(in) and the output signal f(out) will be described more specifically with reference to FIGS. 8A–8D. FIGS. 8A and 8B respectively show the waveform of an input signal f2(in) and that of an output signal f2(out) appearing when the center frequency of the input signal f(in) is f2 lying in the pass band. As shown, because the center frequency f2 of the input signal f2(in) lies in the pass band, i.e., because the pass gain is 0 dB, the level of the output signal f2(out) does not change at all. Therefore, receipt sensitivity does not fall so long as the frequency band of the input signal f(in) lies in the pass band f1–f3.

Figure 8C:
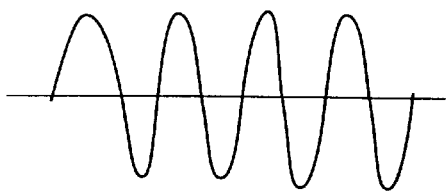
Figure 8D:
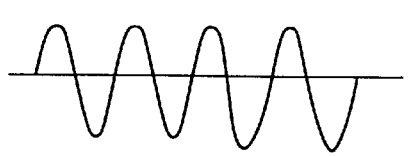

FIGS. 8C and 8D respectively show the waveform of an input signal f4(in) and that of an output signal f4(out) appearing when the center frequency of the input signal f(in) is f4 lying in the stopping band. As shown, because the center frequency f4 of the input signal f4(in) lies in the stopping band, i.e., because the pass gain is –10 dB, the level of the output signal f4(out) is attenuated in accordance with the pass gain. Therefore, receipt sensitivity falls noticeably when the frequency band of the input signal f(in) does not lie in the pass band f1–f3.

Figure 9:
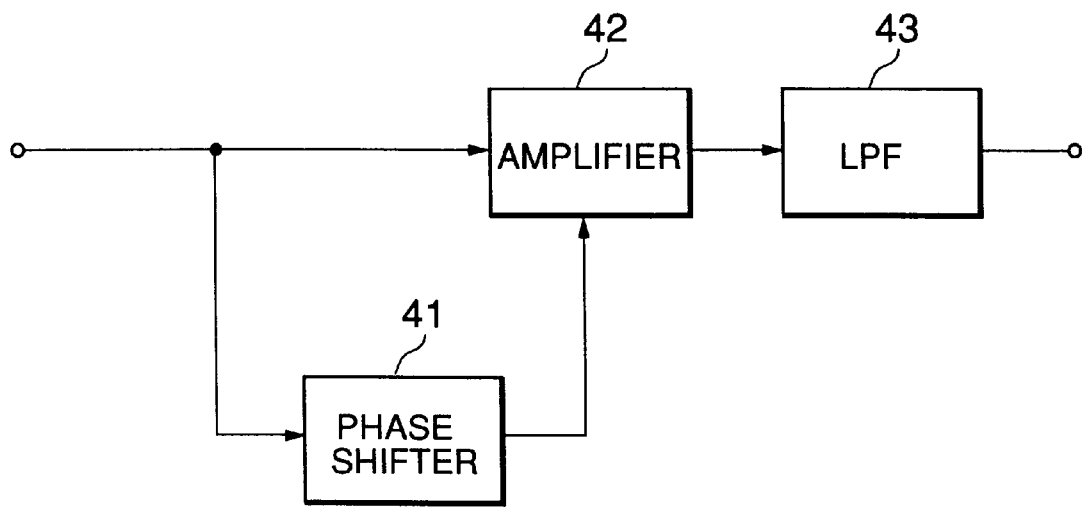
FIG. 9 shows a preferred configuration of a frequency discriminator shown in FIG. 2.

FIG. 9 shows a preferred configuration of the frequency discriminator 17 shown in FIG. 2.

As shown in FIG. 9, the IF signal output from the amplifier 16, FIG. 2, is shifted in phase by a phase shifter 41 and then applied to a multiplier 42. The multiplier 42 multiplies the signal shifted in phase and the signal not shifted in phase. The multiplier 42 feeds to a low pass filter (LPF) 43 a demodulated signal detected from the beat component of the output by frequency modulation. The LPF 43 removes needless components from the demodulated signal and outputs the resulting signal as a baseband signal.

Figure 10:
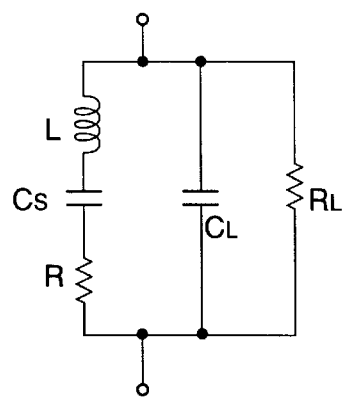
FIG. 10 shows a preferred configuration of a phase shifter shown in FIG. 9.

FIG. 10 shows a preferred configuration of the phase shifter 41 shown in FIG. 9. As shown, the phase shifter 41 is made up of a ceramic oscillator and a resistor RL. The shift of −90±α (−90≦α≦90) degrees stated earlier is derived from a delay of 90 degrees implemented by a capacitor, not shown, preceding the ceramic oscillator and a delay implemented by the ceramic oscillator.

Figure 11:
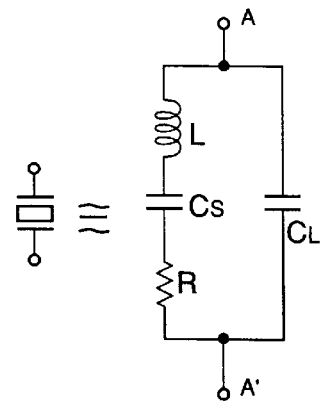
FIG. 11 shows a preferred configuration of a ceramic oscillator included in the configuration of FIG. 10.

As shown in FIG. 11, the ceramic oscillator of FIG. 10 has a serial resonance point and a parallel resonance point. The portion between the serial resonance point and the parallel resonance point constitutes an inductor. The impedance between the points A and A' is zero at the serial resonance point and infinite (∞) at the parallel resource point, as shown in FIGS. 12A and 12B.

Figure 12A:
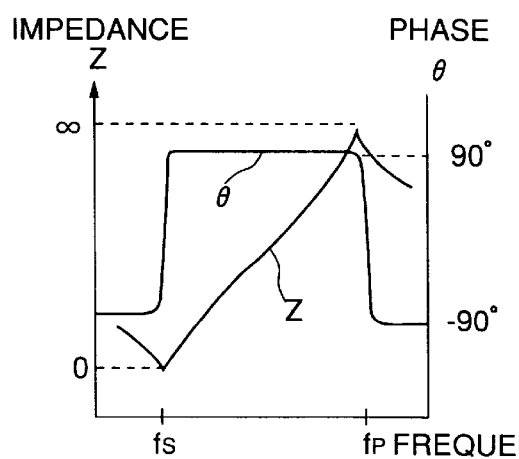
FIGS. 12A and 12B show the preferred frequency characteristic of the phase shifter shown in FIG. 9.

Specifically, in FIG. 12A, the ceramic oscillator shows the L characteristic between frequencies fs and fp, i.e., the voltage is advanced in phase by 90 degrees relative to the current. At the other frequencies, the ceramic oscillator shows the C characteristic, i.e., the voltage is delayed in phase by 90 degrees relative to the current.

Figure 12B:
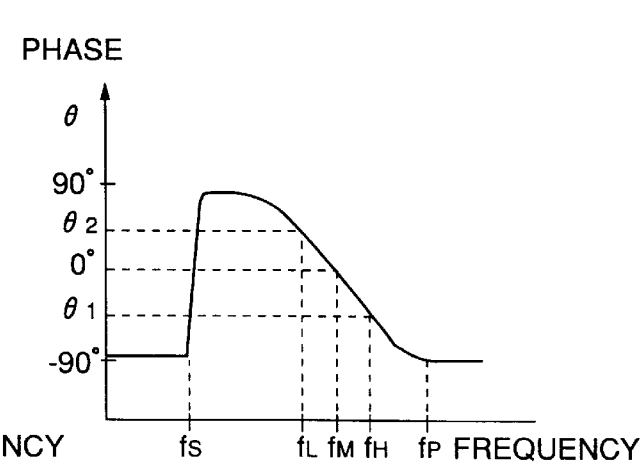

In FIG. 12B, as the frequency varies from fs to fp due to the influence of the resistor RL, the phase characteristic slowly varies from 90 degrees to −90 degrees. This portion of the phase characteristic is used to effect particular phase delay for each frequency.

Figure 13:
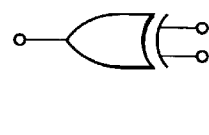
FIG. 13 shows a preferred configuration of a multiplier also included in the configuration of FIG. 9.

FIG. 13 shows a preferred configuration of the multiplier 42 shown in FIG. 9. As shown, the multiplier 42 uses Exclusive-OR (EX-OR).

Figure 14:
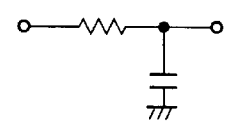
FIG. 14 shows a preferred configuration of a low pass filter further included in the configuration of FIG. 9.

FIG. 14 shows a preferred configuration of the LPF 43 also shown in FIG. 9.

Figure 15:
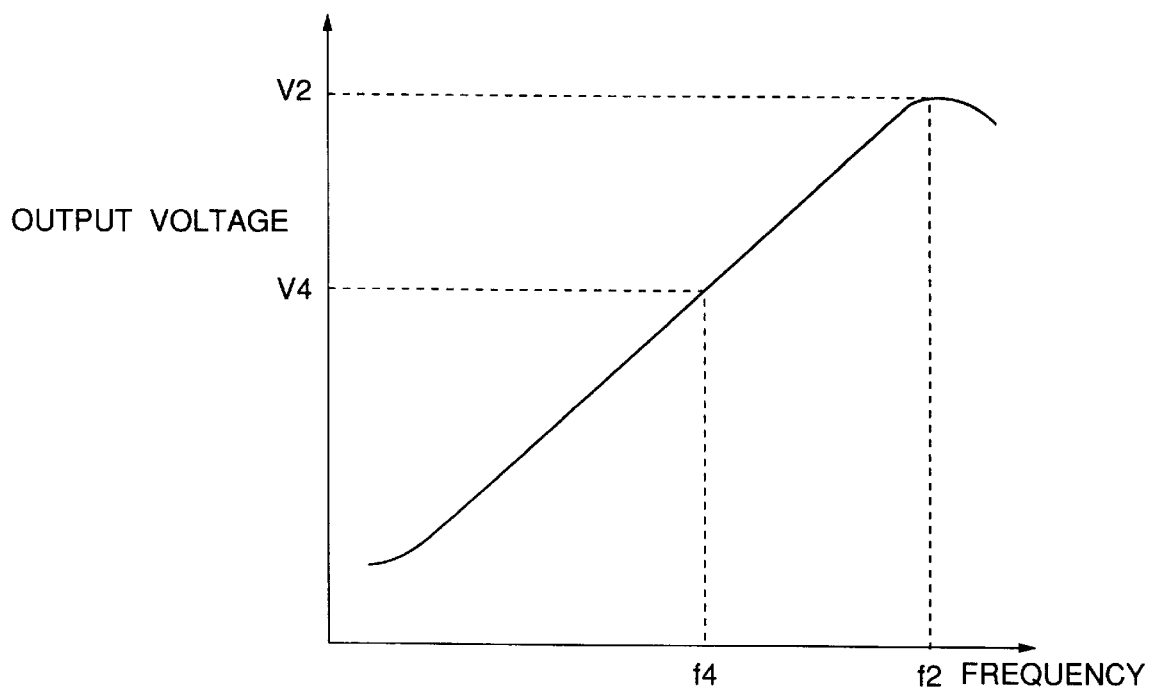
FIG. 15 shows a preferred output characteristic of the frequency discriminator of the embodiment to frequency shifts.

FIG. 15 shows the output characteristic of the frequency discriminator 17, FIG. 2, to frequency transition. Input frequencies f2 and f4 shown in FIG. 15 respectively correspond to the frequencies f2 and f4 shown in FIGS. 8A–8D. Demodulated output voltages V2 and V4 are derived from the input frequencies f2 and f4, respectively. It will be seen that when the input signal has a frequency band lying in the pass band f2, there is produced the demodulated output voltage V2 higher than the demodulated output voltage V4 to be output when the frequency band of the input signal lies in the stopping band f4.

Figure 16:
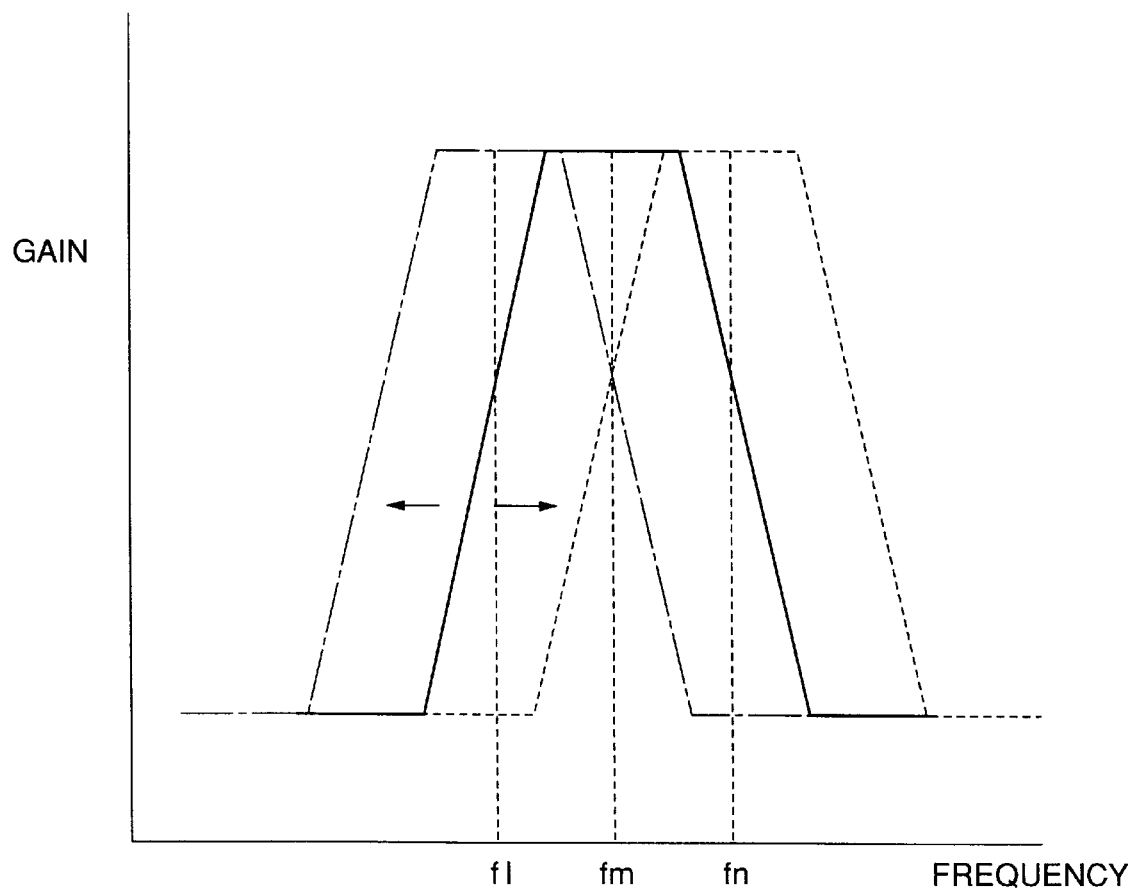
FIG. 16 shows a preferred frequency characteristic of the gyrator filter shown in FIG. 2.

The operation of the gyrator filter 14, FIG. 2, will be described with reference to FIG. 16 showing the frequency characteristic of the filter 14. As shown, when the IF signal input to the filter 14 is free from the influence of temperature variation, i.e., a frequency offset, it has a center frequency fin. When the IF signal is influenced by temperature variation, i.e., shifted to the lower frequency side due to a frequency offset, it has a center frequency fl. Further, the IF signal has a center frequency fh when it is shifted to the higher frequency side due to a frequency offset. On the other hand, in the initial state of the filter 14, the center frequency is identical with the center frequency fm.

First, assume that the IF signal input to the gyrator filter 14 is free from a frequency offset, i.e., the center frequency of the IF signal substantially coincides with the center frequency of the filter 14. A frequency offset does not occur at, e.g. . . . , 25 degrees.

In this condition, the DC voltage Vd which the integrator 18 outputs by integrating the baseband signal fed from the frequency discriminator 17 is substantially equal to the reference voltage Vr. Therefore, the voltage-to-current converter 19 does not output any error signal Ic. It follows that the control current Ig fed from the current source 15 to the filter 14 does not increase or decrease, preventing the frequency characteristic of the filter 14 from being shifted. That is, because the control current Ig fed to the filter 14 remains constant, the center frequency fm of the filter 14 does not change. In this manner, the center frequency of the filter 14 remains as stable as in the initial state. At this instant, the frequency band fm of the IF signal input to the filter 14 lies in the pass band shown in FIG. 7. Consequently, the output voltage is not attenuated, as shown in FIG. 15, and prevents receipt sensitivity from being deteriorated.

On the other hand, assume that the IF signal input to the filter 14 includes a frequency offset, i.e., a frequency offset occurs in the local oscillation frequency signal output from the local oscillator 13 due to temperature variation.

First, when the frequency band of the local oscillation frequency signal is lowered due to temperature variation, the frequency band of the IF signal which the radio 12 outputs by mixing the received signal and low frequency local oscillation frequency signal increases. That is, the frequency band of the IF signal input to the filter 14 rises from the initial frequency fm to the frequency fh. The increase in the frequency band of the IF signal input to the filter 14 results in an increase in the DC voltage of the baseband signal output from the frequency discriminator 17 and therefore an increase in the DC voltage Vd output from the integrator 18. Consequently, the DC voltage Vd rises above the reference voltages Vr (Vd>Vr). Therefore, the voltage-to-current converter 19 produces an error current Ic. The error current Ic is added to the control current Ig output from the current source 15 and then applied to the filter 14. The resulting increase in the control current Ig causes the frequency characteristic of the filter 14 to shift to the higher frequency side. As a result, the center frequency of the filter 14 shifts from fm to fh and remains stable. In this manner, when the frequency band of the IF signal input to the filter 14 rises due to the fall of the frequency band of the local oscillation frequency signal, the frequency characteristic of the filter 14 shifts to the higher frequency side. This successfully prevents receipt frequency from being deteriorated.

When the frequency band of the local oscillation frequency signal rises due to temperature variation, the frequency band of the IF signal output from the ratio 12 and input to the filter 14 falls from the initial fm to fl. The decrease in the frequency band of the IF signal results in a decrease in the DC voltage of the baseband signal output from the frequency discriminator 17 and therefore a decrease in the DC voltage Vd output from the integrator 18. As a result, the DC voltage Vd falls below the reference voltage Vr (Vd<Vr). Therefore, the voltage-to-current converter 19 produces an error signal Ic in the opposite direction to the error signal Ic derived from the fall of the frequency band of the local oscillation frequency signal. The control current Ig output from the current source 15 is reduced by an amount corresponding to the error current Ic and then applied to the filter 14. On the decrease of the control current Ig input to the filter 14, the frequency characteristic of the filter 14 shifts to the lower frequency side. In this manner, when the frequency band of the IF signal input to the filter 14 falls due to the rise of the frequency band of the local oscillation frequency signal, the frequency characteristic of the filter 14 shifts to the lower frequency side. This also successfully prevents receipt frequency from being deteriorated.

In the above embodiment, when the frequency band of the IF signal input to the gyrator filter 14 varies, the frequency characteristic of the filter 14 is caused to shift. It may occur that a frequency offset occurs in the received signal due to a transmission system or a transfer system. A frequency offset in the received signal would cause a frequency offset of the same amount to occur in the frequency band of the IF signal in the same direction. In such a case, the feedback loop operates in the same manner as in the illustrative embodiment in order to shift the frequency characteristic of the filter 14 and maintain it stable, thereby freeing receipt sensitivity from deterioration.

In summary, in accordance with the present invention, a gyrator filter has its frequency characteristic shifted in accordance with the frequency band of an IF signal input to the filter. Specifically, the frequency characteristic of the gyrator filter is shifted to the higher frequency side when the frequency band of the IF signal rises due to temperature variation, or shifted to the lower frequency side when it falls. In any case, the frequency band of the IF signal input to the gyrator filter remains in a pass band. Therefore, even when a frequency offset occurs due to temperature variation, the frequency characteristic of the gyrator filter remains stable and insures desirable receipt sensitivity.

Further, the present invention reduces the influence of a frequency offset ascribable to temperature variation without resorting to any reference signal generating circuit or reference signal. This successfully reduces the size and cost of a radio pager.

In addition, the pass band of the gyrator filter is shifted in accordance with the above frequency offset without being broadened. This protects a receiver from deterioration in CN power ratio.

Obviously, numerous additional modifications and variations of the present invention are possible in light of the above teachings. It is therefore to be understood that within the scope of the appended claims, the invention may be practiced otherwise than as specifically described herein.

What is claimed is:

1. A receiver comprising:

a radio section for amplifying a received signal to thereby output an amplified signal;

a filter for inputting the amplified signal and having a preselected frequency characteristic;

feeding means for feeding a first control signal to said filter;

first outputting means for outputting a second control signal corresponding to the frequency of said amplified signal;

second outputting means for outputting a third control signal corresponding to a difference between said second control signal and preselected reference value;

control means for controlling the preselected frequency characteristic of said filter in accordance with said first control signal and said third control signal;

wherein the first control signal, the second control signal and the third control signal, comprise a control current, a DC voltage, and an error current, respectively; and wherein said second outputting means converts a difference between a center voltage of said DC voltage and the preselected reference voltage to said error current.

2. A receiver as claimed in claim 1, wherein said amplified signal is a frequency converted signal.

3. A receiver as claimed in claim 1, wherein said filter comprises a gyrator filter.

4. A receiver as claimed in claim 1, wherein said receiver comprises a radio pager.

5. A receiver comprising:

a radio section for amplifying a received signal to thereby output an amplified signal;

a filter having a preselected frequency characteristic;

a current source for feeding a first control signal to said filter;

an integrator for outputting a second control signal corresponding to said amplified signal;

a voltage-to-current converter for outputting a third control signal corresponding to a difference between said second control signal and a preselected reference value; and a controller for controlling the preselected frequency characteristic of said filter in accordance with the first control signal and the third control signal.

6. A device for controlling frequency characteristic of a filter, comprising:

a filter having a preselected frequency characteristic;

a current source for feeding a first control signal to said filter;

an integrator for outputting a second control signal corresponding to an output signal of said filter;

a voltage-to-current converter for outputting a third control signal corresponding to a difference between the second control signal and a preselected reference value; and a controller for controlling the preselected frequency characteristic of said filter in accordance with the first control signal and the third control signal.

* * * * *